United States Patent
Kato et al.

(10) Patent No.: US 8,994,031 B2
(45) Date of Patent: Mar. 31, 2015

(54) GALLIUM NITRIDE COMPOUND SEMICONDUCTOR LIGHT EMITTING ELEMENT AND LIGHT SOURCE PROVIDED WITH SAID LIGHT EMITTING ELEMENT

(71) Applicant: Panasonic Corporation, Osaka (JP)

(72) Inventors: Ryou Kato, Osaka (JP); Shunji Yoshida, Osaka (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 46 days.

(21) Appl. No.: 13/742,484

(22) Filed: Jan. 16, 2013

(65) Prior Publication Data

US 2013/0126898 A1    May 23, 2013

Related U.S. Application Data

(63) Continuation of application No. PCT/JP2012/000214, filed on Jan. 16, 2012.

(30) Foreign Application Priority Data

Jan. 21, 2011 (JP) .................. 2011-010906

(51) Int. Cl.
*H01L 33/32* (2010.01)
*H01L 33/06* (2010.01)
(Continued)

(52) U.S. Cl.
CPC ............... *H01L 33/32* (2013.01); *H01L 33/007* (2013.01); *H01L 33/06* (2013.01); *H01L 33/16* (2013.01)
USPC ................. 257/76; 257/14; 257/79; 257/103; 438/46

(58) Field of Classification Search
USPC ........................... 257/14, 76, 79, 103
See application file for complete search history.

(56) References Cited

U.S. PATENT DOCUMENTS

2005/0211971 A1    9/2005    Okumura
2005/0224781 A1    10/2005    Kneissl et al.
(Continued)

FOREIGN PATENT DOCUMENTS

JP    07-235505 A    9/1995
JP    2007-150066 A    6/2007
(Continued)

OTHER PUBLICATIONS

International Search Report for corresponding International Application No. PCT/JP2012/000214 mailed Feb. 14, 2012.
(Continued)

*Primary Examiner* — Matthew W Such
*Assistant Examiner* — David Spalla
(74) *Attorney, Agent, or Firm* — Renner, Otto, Boisselle & Sklar, LLP

(57) ABSTRACT

In a gallium nitride based compound semiconductor light-emitting element including an active layer, the active layer includes a well layer 104 and a barrier layer 103, each of which is a semiconductor layer of which the growing plane is an m plane. The well layer 104 has a lower surface and an upper surface and has an In composition distribution in which the composition of In changes according to a distance from the lower surface in a thickness direction of the well layer 104. The In composition of the well layer 104 becomes a local minimum at a level that is defined by a certain distance from the lower surface and that portion of the well layer 104 where the In composition becomes the local minimum runs parallel to the lower surface.

16 Claims, 8 Drawing Sheets

(51) Int. Cl.
*H01L 33/00* (2010.01)
*H01L 33/16* (2010.01)

(56) References Cited

U.S. PATENT DOCUMENTS

| | | | |
|---|---|---|---|
| 2005/0263780 A1* | 12/2005 | Bour et al. | 257/94 |
| 2009/0166668 A1 | 7/2009 | Shakuda | |
| 2009/0206322 A1* | 8/2009 | Brandes | 257/13 |
| 2009/0252191 A1* | 10/2009 | Kubota et al. | 372/50.11 |
| 2009/0258452 A1 | 10/2009 | Enya et al. | |
| 2009/0268768 A1 | 10/2009 | Ueno et al. | |
| 2011/0156048 A1 | 6/2011 | Yokogawa et al. | |

FOREIGN PATENT DOCUMENTS

| | | |
|---|---|---|
| JP | 2009-221056 A | 10/2009 |
| JP | 2009-245982 A | 10/2009 |
| JP | 2009-253164 A | 10/2009 |
| JP | 2009-267124 A | 11/2009 |
| JP | 2010-232290 A | 10/2010 |
| WO | 2007/026767 A1 | 3/2007 |
| WO | 2007/063832 A1 | 6/2007 |
| WO | 2010/052810 A1 | 5/2010 |

OTHER PUBLICATIONS

Form PCT/ISA/237 for corresponding International Application No. PCT/JP2012/000214 dated Feb. 14, 2012 and partial English translation.

Notice of Reasons for Rejection for Japanese Application No. 2012-524021 issued Jul. 3, 2012 which is a national phase application of PCT/JP2012/000214 and a full English translation.

* cited by examiner

● N
● Ga

FIG.5
(a)
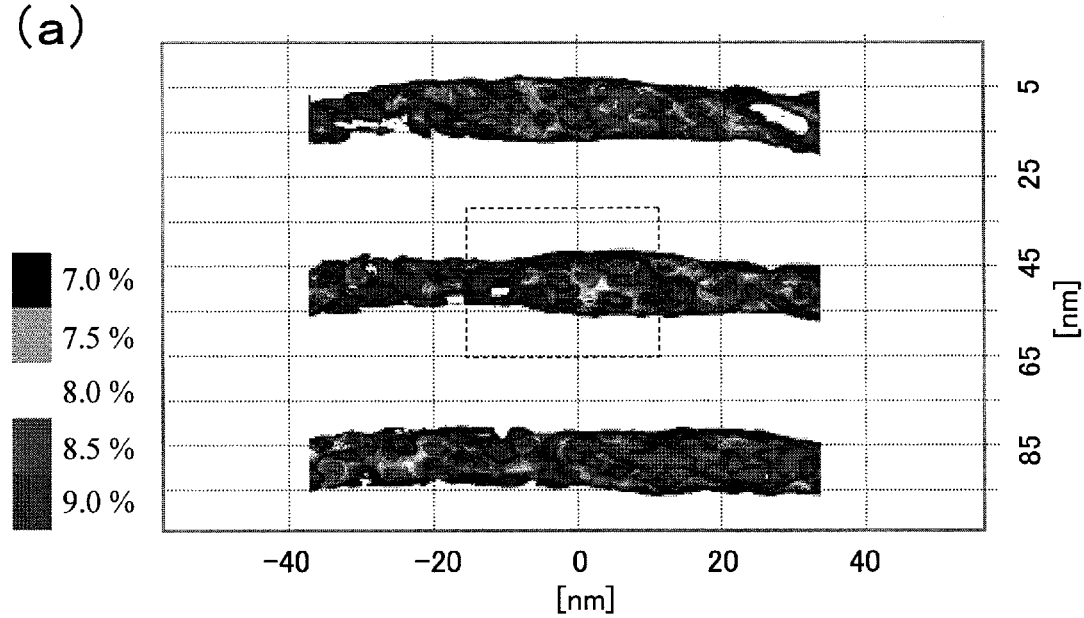
(b)
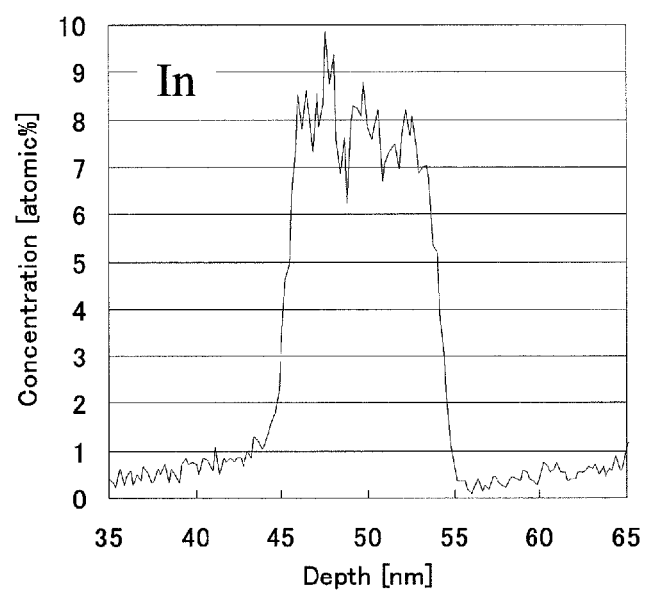

FIG.6
(a)
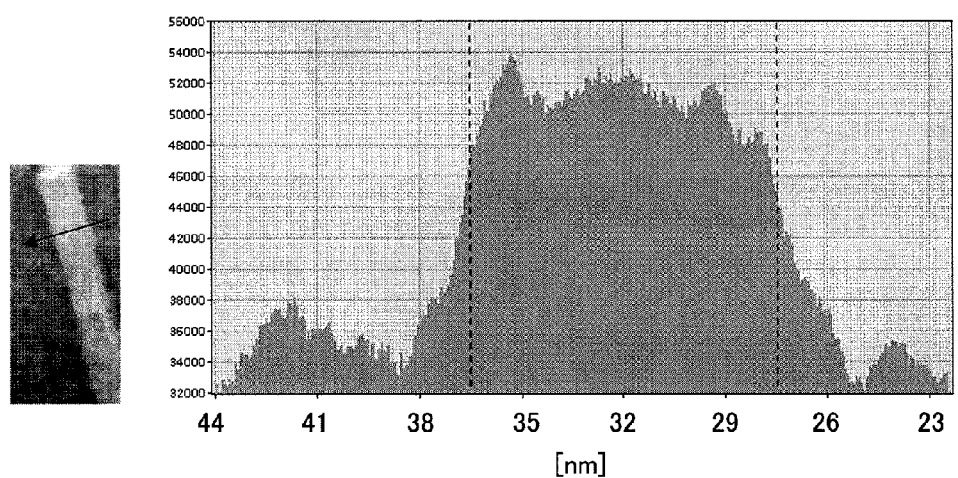
(b)
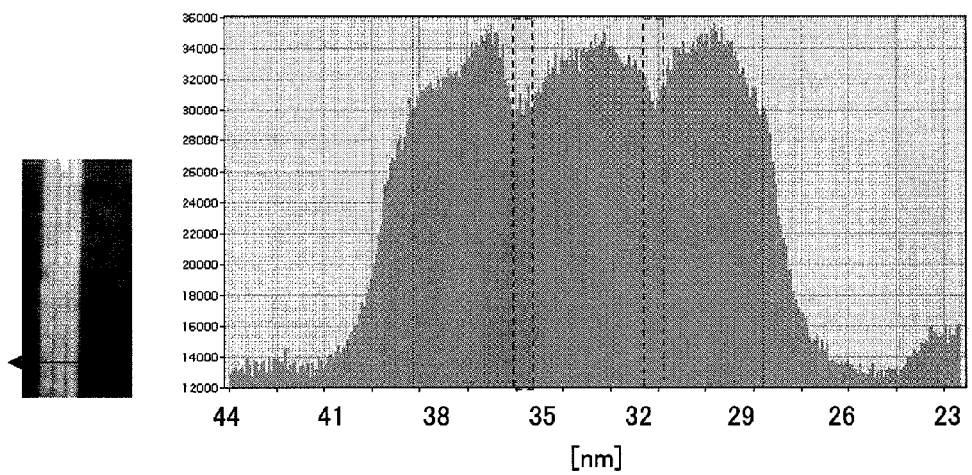

GALLIUM NITRIDE COMPOUND SEMICONDUCTOR LIGHT EMITTING ELEMENT AND LIGHT SOURCE PROVIDED WITH SAID LIGHT EMITTING ELEMENT

This is a continuation of International Application No. PCT/JP2012/000214, with an international filing date of Jan. 16, 2012, which claims priority of Japanese Patent Application No. 2011-010906, filed on Jan. 21, 2011, the contents of which are hereby incorporated by reference.

BACKGROUND

1. Technical Field

The present disclosure relates to a gallium nitride based compound semiconductor light-emitting element and also relates to a light source including the light-emitting element (which is typically a white light source).

2. Description of the Related Art

A nitride semiconductor including nitrogen (N) as a Group V element is a prime candidate for a material to make a short-wave light-emitting element, because its bandgap is sufficiently wide. Among other things, gallium nitride-based compound semiconductors (which will be referred to herein as "GaN-based semiconductors") have been researched and developed particularly extensively. As a result, blue-ray-emitting light-emitting diodes (LEDs), green-ray-emitting LEDs and semiconductor laser diodes made of GaN-based semiconductors have already been used in actual products.

A GaN-based semiconductor has a wurtzite crystal structure. FIG. 1 schematically illustrates a unit cell of GaN. In an $Al_aGa_bIn_cN$ (where $0 \leq a, b, c \leq 1$ and $a+b+c=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c axis". A plane that intersects with the c axis at right angles is called either a "c plane" or a "(0001) plane". It should be noted that the "c axis" and the "c plane" are sometimes referred to as "C axis" and "C plane".

As shown in FIG. 3, the wurtzite crystal structure has other representative crystallographic plane orientations, not just the c plane. Portions (a), (b), (c) and (d) of FIG. 3 illustrate a (0001) plane, a (10-10) plane, a (11-20) plane, and a (10-12) plane, respectively. In this case, "−" attached on the left-hand side of a Miller-Bravais index in the parentheses means a "bar" (a negative direction index). The (0001), (10-10), (11-20) and (10-12) planes are c, m, a and r planes, respectively. The m and a planes are "non-polar planes" that are parallel to the c axis but the r plane is a "semi-polar plane". It should be noted that the m plane is a generic term that collectively refers to a family of (10-10), (−1010), (1-100), (−1100), (01-10) and (0-110) planes.

Light-emitting elements that use gallium nitride based compound semiconductors have long been made by "c-plane growth" process. In this description, the "X-plane growth" means epitaxial growth that is produced perpendicularly to the X plane (where X=c, m, a or r, for example) of a hexagonal wurtzite structure. As for the X-plane growth, the X plane will be sometimes referred to herein as a "growing plane". Furthermore, a layer of semiconductor crystals that have been formed as a result of the X-plane growth will be sometimes referred to herein as an "X-plane semiconductor layer".

If a light-emitting element is fabricated as a semiconductor multilayer structure by c-plane growth process, then intense internal electric polarization will be produced perpendicularly to the c plane (i.e., in the c axis direction), because the c plane is a polar plane. Specifically, that electric polarization is produced, because on the c-plane, Ga and N atoms are located at different positions with respect to the c axis. Once such electric polarization is produced in a light-emitting layer (i.e., in an active layer), the quantum confinement Stark effect of carriers will be generated. As a result, the probability of radiative recombination of carriers in the light-emitting layer decreases, thus decreasing the luminous efficiency as well.

To overcome such a problem, a lot of people have recently been making every effort to grow gallium nitride based compound semiconductors on a non-polar plane such as an m or a plane or on a semi-polar plane such as an r plane. If a non-polar plane can be selected as a growing plane, then no electric polarization will be produced in the thickness direction of the light-emitting layer (i.e., in the crystal growing direction). As a result, no quantum confinement Stark effect will be generated, either. Thus, a light-emitting element with potentially high efficiency can be fabricated. The same can be said even if a semi-polar plane is selected as a growing plane. That is to say, the influence of the quantum confinement Stark effect can be reduced significantly in that case, too.

FIG. 4(a) schematically illustrates the crystal structure of a nitride-based semiconductor, of which the principal surface is an m plane, as viewed on a cross section thereof that intersects with the principal surface of the substrate at right angles. The Ga atoms and nitrogen atoms are on the same atomic plane that is parallel to the m plane. For that reason, no electric polarization will be produced perpendicularly to the m plane. It should be noted that In and Al atoms that have been added are located at Ga sites to replace Ga atoms. Even when at least some of the Ga atoms are replaced with In and Al atoms, no electric polarization will be produced perpendicularly to the m plane, either.

The crystal structure of a nitride-based semiconductor, of which the principal surface is a c plane, as viewed on a cross section thereof that intersects with the principal surface of the substrate at right angles is illustrated schematically in FIG. 4(b) just for your reference. In this case, Ga atoms and nitrogen atoms are not present on the same atomic plane that is parallel to the c plane. For this reason, the electric polarization will be produced perpendicularly to the c plane. A c-plane GaN-based substrate is generally used as a substrate to grow GaN based semiconductor crystals thereon. As the positions of the Ga (or In) atomic layer and nitrogen atomic layer, which are parallel to the c plane, slightly shift from each other in the c-axis direction, electric polarization is produced in the c-axis direction.

According to the manufacturing process disclosed in Japanese Laid-Open Patent Publication No. 2009-253164, in the process step of forming a quantum well structure (as an active layer 50) by alternately growing barrier layers 43, 45, 47 and 49 and well layers 44, 46 and 48 on the principal surface of a GaN substrate 40 in order to minimize a variation in the In composition in the thickness direction of the well layers, each of those well layers is formed by growing InGaN, the growing temperature of each of those barrier layers is set to be a first temperature, the growing temperature of each of those well layers is set to be a second temperature that is lower than the first temperature, and the source gas of In starts to be supplied before the source gas of Ga (trimethylgallium) starts to be supplied in growing each well layer.

According to a method for fabricating a nitride semiconductor laser diode as disclosed in Japanese Laid-Open Patent Publication No. 2009-267124, in order to make a nitride semiconductor laser diode in which indium in InGaN well layers can have a more uniform composition, an InGaN thin film, of which the thickness DW1 is smaller than the thickness DW0 of the well layers (i.e., DW1<DW0), is deposited at a temperature T1 by supplying TMG, TMIn and $NH_3$ to the growing furnace in Step S110. This thin film has a thickness of 1 nm. Next, in Step S111, with the TMIn and $NH_3$ still supplied to the growing furnace, the temperature is changed from T1 into T2 (where T1<T2). Then, in Step S112, the temperature is maintained at T2 with TMIn and $NH_3$ supplied to the growing furnace. And in Step S113, the temperature is changed from T2 into T1 with the TMIn and $NH_3$ supplied to the growing furnace.

In the active layer 5 of the light-emitting element disclosed in PCT International Application Publication No. 2007/026767, a delta layer 4 is embedded in a single quantum well layer of InGaN, thus splitting the quantum well layer into two quantum well layers 3A and 3B. To affect the movement of carriers, the delta layer 4 may have a broader band gap than the quantum well layers 3A and 3B. However, unlike the barriers adopted in the known multiple quantum well (MQW) structure, its thickness is set to be approximately 1 nm in order to substantially induce the movement of electrons and holes.

The nitride semiconductor light-emitting element disclosed in Japanese Laid-Open Patent Publication No. 2007-150066 has a nitride semiconductor multilayer portion 6, including at least an active layer 4 with a light-emitting portion, on a substrate 1 and the active layer 4 has a multiple quantum well structure in which $In_xGa_{1-x}N$ (where $0<x\leq1$) well layers 7 and $Al_yIn_zGa_{1-y-z}N$ (where $0\leq y<1, 0\leq z<1, 0\leq y+z<1$ and $z<x$) barrier layers 8 are stacked alternately. And each of those well layers 7 is split by an $Al_vIn_wGa_{1-v-w}N$ (where $0\leq v<1, 0\leq w<1, 0\leq v+w<1$ and $w<x$) thin-film barrier layer 7c into at least first and second well layers 7a and 7b. And the thin-film barrier layer 7c is formed to be at least as thick as one atomic layer and have a thickness of 20 Å or less.

Japanese Laid-Open Patent Publication No. 2010-232290 discloses a nitride semiconductor light-emitting diode which includes at least an n-type nitride semiconductor layer, an active layer, and a p-type nitride semiconductor layer and of which the active layer has multiple light-emitting layers including at least two layers with mutually different In mixed crystal ratios that are in contact with each other.

The luminous efficiency achieved by these technologies of the related art still needs to be increased.

SUMMARY

A gallium nitride based compound semiconductor light-emitting element according to the present disclosure includes an active layer. The active layer includes a well layer and a barrier layer, each of the well layer and the barrier layer being a semiconductor layer which has an m plane as its growing plane. The well layer has a lower surface and an upper surface and has an In composition distribution in which the composition of In changes according to a distance from the lower surface in a thickness direction of the well layer. The In composition of the well layer has a local minimum at a level that is defined by a certain distance from the lower surface and a portion of the well layer where the In composition has the local minimum runs parallel to the lower surface.

Another gallium nitride based compound semiconductor light-emitting element according to the present disclosure includes an active layer. The active layer includes a well layer and a barrier layer, each of the well layer and the barrier layer being a semiconductor layer which has an m plane as its growing plane. The well layer includes at least one dividing layer which divides the well layer into multiple partial layers. The In composition of the dividing layer is less than 90% of the In composition of the partial layers.

A light source according to the present disclosure includes: a gallium nitride based compound semiconductor light-emitting element according to any of the embodiments described above; and a wavelength changing section which includes a phosphor that changes the wavelength of light emitted from the gallium nitride based compound semiconductor light-emitting element.

A method for fabricating a gallium nitride based compound semiconductor light-emitting element according to the present disclosure includes the steps of: forming a well layer, of which the growing plane is an m plane and in which the composition of In changes in the thickness direction; and forming a barrier layer, of which the growing plane is an m plane. The step of forming the well layer includes reducing or stopping the supply of In during the process of growing the well layer while supplying an In source material.

According to the present disclosure, the increase of the luminous efficiency is achieved.

These general and specific aspects may be implemented using a system, a method, and a computer program, and any combination of systems, methods, and computer programs.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF DRAWINGS

FIGS. 5(*a*) and 5(*b*) show the results of a three-dimensional atomic probe analysis which was carried out to see how an In composition fluctuated in the thickness direction of an InGaN well layer when the present disclosure was not applied thereto.

FIGS. 6(*a*) and 6(*b*) show the results of analysis of a high resolution cross-sectional TEM (transmission electron microscope) which was carried out to prove the effect of the present disclosure by comparison.

DETAILED DESCRIPTION

Figure 1:
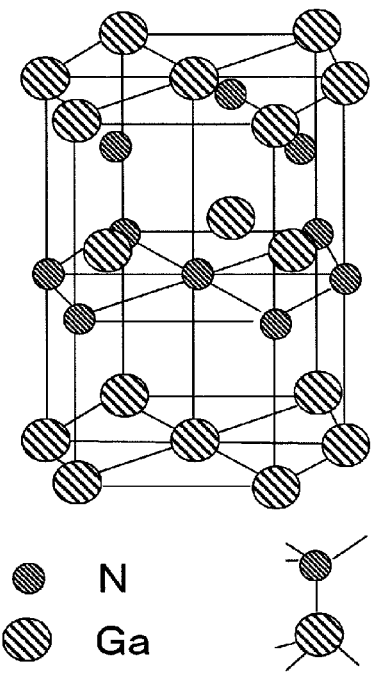
FIG. 1 is a perspective view schematically illustrating a unit cell of GaN.
Figure 2:
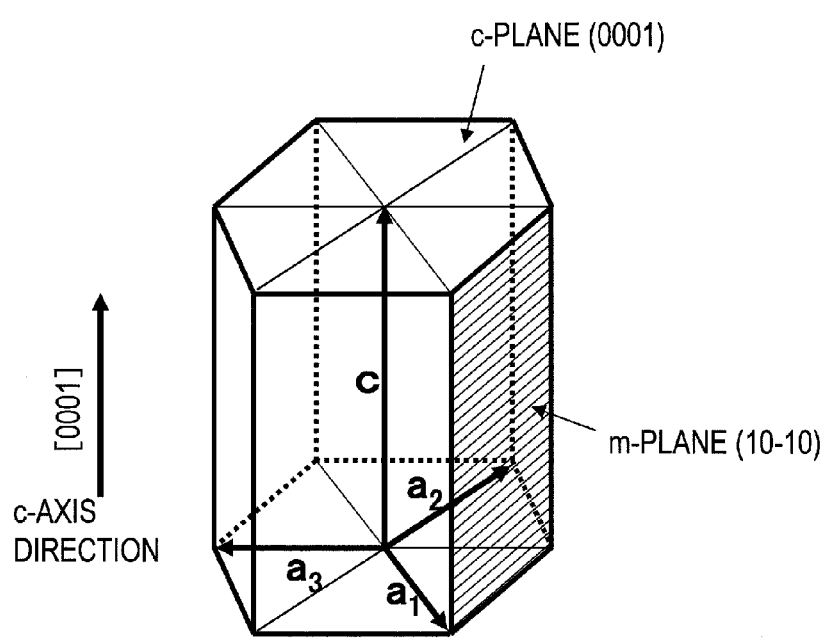
FIG. 2 is a perspective view showing the four primitive vectors $a_1$, $a_2$, $a_3$ and c of a wurtzite crystal structure.
Figure 3:
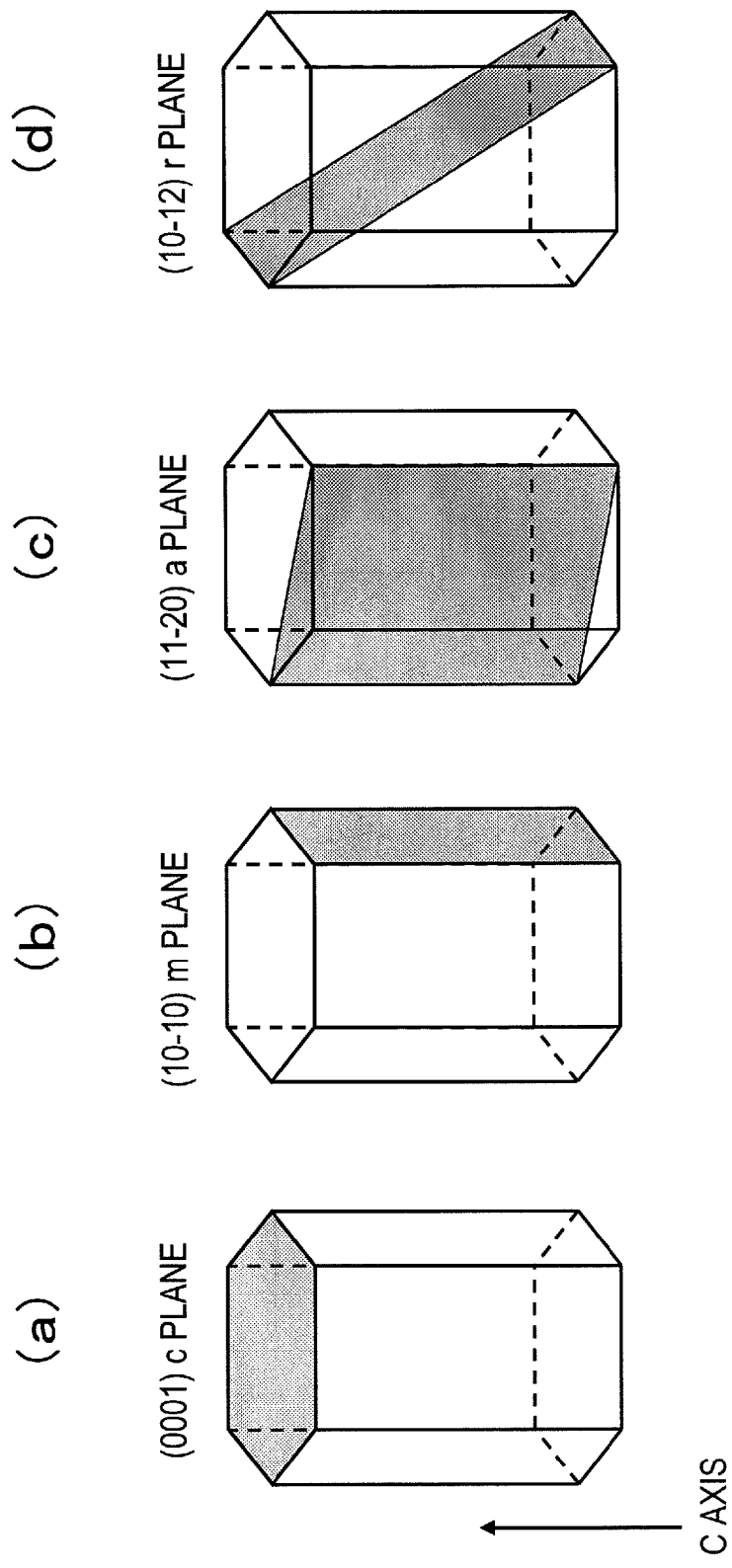
FIGS. 3(*a*) through 3(*d*) are schematic representations illustrating representative crystallographic plane orientations of a hexagonal wurtzite structure.
Figure 4:
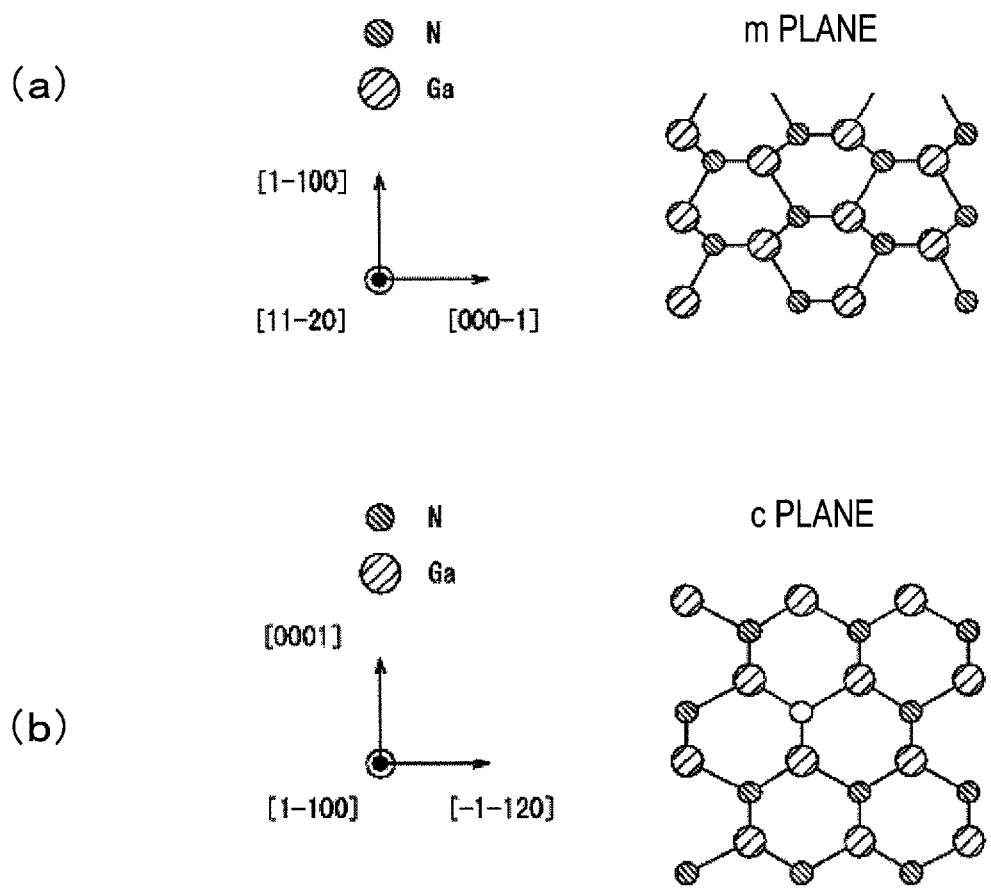
FIG. 4(*a*) illustrates the crystal structure of an m plane and FIG. 4(*b*) illustrates the crystal structure of a c plane.

In most cases, gallium nitride based compound semiconductor light-emitting elements have long been fabricated using a c plane as their growing plane. In a c-plane growing process, however, it is impossible to avoid producing the quantum confinement Stark effect in an InGaN well layer that forms its light-emitting layer (active layer). As a result, the InGaN well layer is generally controlled to have a thickness of 5 nm or less typically. Once the quantum confinement Stark effect has been produced, the probability of radiative recombination of carriers decreases to cause a decrease in luminous efficiency, too. That is why to prevent the quantum confinement Stark effect from being produced, there has been no choice but to reduce the thickness of the InGaN well layer.

On the other hand, in a non-polar plane (e.g., m plane) growing process, the quantum confinement Stark effect is never produced in the first place. That is why even if the thickness of the InGaN well layer is set to be 5 nm or more, the luminous efficiency will not decrease in principle. The present inventors separately discovered and confirmed via experiments that when the thickness of an m-plane-growing InGaN layer was 6 nm or more and fell within a certain range, very high luminous efficiency, which would never have been achieved by any traditional c-plane growing process, was achieved.

The present inventors discovered that when a thick InGaN well layer was deposited, a significant fluctuation occurred in the In composition in the thickness direction (i.e., in the depth direction). The present inventors also discovered that such a significant fluctuation in the In composition could be a factor causing a decrease in the production yield of the light-emitting element eventually, because the emission wavelength could be far different from its target value or could vary due to the operating environment or condition of the element in such a situation. As for the c-plane growing process, on the other hand, it is rare to deposit an InGaN layer to a thickness of more than 5 nm as described above, and therefore, such a fluctuation in the In composition in the thickness direction has never been a problem.

In this description, the "thickness direction" refers herein to a direction which intersects with the crystal growing plane at right angles and in which a semiconductor layer grows. For example, if "the In composition increases in the thickness direction", then it means that the In composition increases from the lower surface of a semiconductor layer (i.e., a level at which the semiconductor layer started to grow) toward its upper surface (i.e., a level at which the semiconductor layer has stopped growing). In this case, the "lower surface" and the "upper surface" are defined no matter which side actually faces upward or downward. Also, even though the "lower surface" of a semiconductor layer corresponds to the "growth starting point" as described above, the "upper surface" does not have to be a "growth end point". For example, if the semiconductor layer is subjected to an etching process, its "upper surface" could be closer to the lower surface than the growth end point is.

An object of an embodiment of the present disclosure is to provide a light-emitting element with good luminous efficiency by depositing an $Al_xIn_yGa_zN$ (where $0 \leq x<1$, $0<y<1$ and $0<z<1$) layer to a thickness of 6 nm or more at a good yield while minimizing the fluctuation in the In composition in the $Al_xIn_yGa_zN$ (where $0 \leq x<1$, $0<y<1$ and $0<z<1$) layer in its thickness direction to a narrow range. Another object of an embodiment of the present disclosure is to provide a light source including such a light-emitting element.

Japanese Laid-Open Patent Publication No. 2009-253164 says "it was discovered that the In composition could be insufficient during an early stage of growth of the well layer due to a difference in lattice constant between the barrier layer and the well layer. That is to say, right after the well layer (of InGaN, for example) has started to grow, In is not introduced sufficiently into it just over the barrier layer (of GaN, for example). However, as the well layer grows thicker, the In composition increases gradually. And when the thickness of the well layer reaches a certain value, the intended In composition is realized". However, when the present inventors carried out an experiment on an InGaN layer having an increased thickness, the present inventors discovered that the In composition certainly tended to fluctuate in the thickness direction of the InGaN layer but did not always increase in the thickness direction but rather decreased in the thickness direction in some cases. Particularly, the In composition is not distributed uniformly within a plane. Thus, depending on the point of analysis, the In composition could increase, decrease or fluctuate (i.e., increase and decrease at random).

In order to cope with an "increase in the spatial fluctuation of an InGaN well layer", Japanese Laid-Open Patent Publication No. 2009-267124 proposes overcoming the problem by a "method comprising the step of forming a first InGaN film, which has a first thickness and which will be an active layer, on a gallium nitride based semiconductor region, characterized in that the step of forming the first InGaN film includes the steps of: supplying a first gallium source material, a first indium source material and a first nitrogen source material to a growing furnace, thereby depositing InGaN to a smaller thickness than the first thickness at a first temperature to form the InGaN film; thermally treating the InGaN at a second temperature, which is higher than the first temperature, while supplying a second indium source material and a second nitrogen source material to the growing furnace; and depositing InGaN at least once after the heat treatment, thereby forming the first InGaN film". According to such a method, however, particularly when a thick InGaN layer needs to be deposited, it takes a very long time to make the device and the productivity decreases significantly.

In the related art, in growing well layers which are separated from each other by a barrier layer in an active layer, it is common to keep principal control parameters unchanged from the beginning through the end of the growing process. In this case, the "principal control parameters" are parameters that define the condition for growing a nitride semiconductor layer and include a growing temperature, a growing pressure, and the flow rates (μmol/min) of source gases supplied. Examples of the "source gases" include source gases of Group III elements such as Ga, In and Al and $NH_3$ which is a source gas of N that is a Group V element. In forming a non-polar m-plane-growing InGaN layer, even if those principal control parameters are fixed, the fluctuation in the In composition in the thickness direction will occur by itself and increase.

The present inventors discovered via experiments that particularly in an InGaN layer which was formed to have such an In composition as to make the emission wavelength higher than 420 nm, the In composition in the InGaN layer increased or decreased in the thickness direction. The present inventors also discovered that the In composition rarely increased or decreased monotonically but often fluctuated and increased and decreased randomly and repeatedly. In a rare case scenario, the In composition hardly fluctuated in the thickness direction. But that was often the case with the InGaN well layer that had been grown so that the emission wavelength would be 420 nm or less. And such a fluctuation in the In composition also occurred perpendicularly to the thickness direction (and such a direction will be sometimes referred to herein as an "in-plane direction"). The In composition distribution in the thickness direction was not uniform at any cross section intersecting with the growing plane at right angles but could be different from one cross section to another.

FIG. 5 shows the results of analysis of the fluctuation in the In composition of the InGaN well layer which was deposited using an m plane as its growing plane. The target thickness of the InGaN well layer was 9 nm and the emission peak wavelength by photoluminescence (PL) measurement was 450 nm.

FIG. 5(a) is a mapped image obtained by measuring the inside of the InGaN well layer by a three-dimensional atomic probe analysis. In this mapped image, the InGaN well layer is divided using a cube of 1 nm×1 nm×1 nm as a unit volume and the In atomic concentration (In composition) in each unit volume is shown. In this description, the atomic concentration of In means the ratio of the number of In atoms to the overall number of atoms to be counted and confirmed as being present in a unit volume. Based on the results of this measurement, the In composition on a cross section is represented by lightness (shade) in FIG. 5(a). Specifically, in FIG. 5(a), the In compositions of three InGaN well layers stacked are represented in mutually different degrees of lightness. On the left-hand side of FIG. 5(a), shown is the relation between the lightness and the In composition. More specifically, "7.0 at %", "7.5 at %", "8.0 at %", "8.5 at %", and "9.0 at %" indicate that the In composition is in the ranges of 6.995 to 7.004 at %, 7.495 to 7.504 at %, 7.995 to 8.004 at %, 8.495 to 8.504 at % and 8.995 to 9.004 at %, respectively. In the graph shown in FIG. 5(a), the ordinate represents the depth of the sample as measured from a reference plane.

FIG. 5(b) is a graph showing a fluctuation in the In composition in the thickness direction of the middle one of the three InGaN well layers of the same sample, which is obtained as an average in a rather broad range within a plane (i.e., the dotted range shown in FIG. 5(a)). Since the dotted range shown in FIG. 5(a) has a width of approximately 30 nm, the In composition at a certain depth corresponds to the average In composition of around thirty 1 nm×1 nm×1 nm cubes that are located at the same depth.

As can be seen from FIG. 5(a), few ranges have the target In composition exactly as intended uniformly in the thickness direction of the well layer, but ranges with high In compositions alternate with ranges with low In compositions almost everywhere in the thickness direction. That is to say, it can be seen that the In composition fluctuates. In this manner, the In composition in the InGaN well layer is uniform neither in the thickness direction nor in the in-plane direction but fluctuates three-dimensionally.

The pattern of the fluctuation in the In composition in the thickness direction is different from one point on a plane under analysis to another. That is to say, the In composition may tend to increase in the thickness direction, tend to decrease in the thickness direction, or increase and decrease repeatedly and randomly. However, as can be seen from the graph shown in FIG. 5(b) showing the average in a rather broad range in a plane, the amplitude of the fluctuation in the In composition tends to increase gradually in the thickness direction. In other words, the fluctuation in the In composition of the InGaN well layer increases with the distance from the lower surface of the InGaN well layer. That is why the thicker the InGaN well layer to be formed, the greater the percentage of a portion of the InGaN well layer with a significant In composition fluctuation.

Such a distribution of In atoms having various compositions in the thickness direction means that emission levels having various wavelengths are produced. Thus, the emission wavelength is often off the target wavelength or is likely to have a broad emission spectrum. This means that the yield of the emission wavelength decreases.

It is not clear why the In composition fluctuates in the thickness direction in the InGaN layer. It is generally believed that such a fluctuation is brought about due to a delay in supply or exhaust of the In source material, which is determined by the performance of the grower (and which is sometimes called a "memory effect"), or due to a composition involvement effect resulting from a lattice misfit with the underlying crystals. In any case, if the amplitude of the In composition fluctuation gradually increases in the thickness direction as shown in FIG. 5(b), the thicker the InGaN well layer is deposited in order to achieve higher internal quantum efficiency, the worse the yield of the emission wavelength should be.

The present inventors confirmed via experiments that if an InGaN layer having an emission wavelength of greater than approximately 420 nm was deposited to a thickness of more than 4 nm, the yield of the emission wavelength started to deteriorate significantly. Thus, the present inventors discovered that in order to deposit an $In_sGa_{1-s}N$ (where 0<s<1) layer to a thickness of more than 4 nm with the In composition fluctuation in the thickness direction suppressed, it would be an effective measure to provide a very thin layer ($In_tGa_{1-t}N$, where 0≤t<s<1) having either a relatively small In composition or even no In atoms at all by reducing or stopping the supply of the In source gas once before the thickness reached 4 nm. In this way, the amplitude of the fluctuation can be restored to the original one before the In composition fluctuation in the thickness direction becomes too significant, and therefore, the In composition fluctuation in the thickness direction can be reduced as a result.

If right after the $In_tGa_{1-t}N$ (where 0≤t<s<1) layer has been deposited, deposition of the $In_sGa_{1-s}N$ (where 0<s<1) layer is resumed under the same growth condition, the In composition would fluctuate again but its amplitude would be just as large as when the $In_sGa_{1-s}N$ (where 0<s<1) layer has started to be deposited. Consequently, the In composition fluctuation in the thickness direction does not increase and the In composition distribution converges within a range with a certain width. That is to say, the $In_tGa_{1-t}N$ (where 0≤t<s<1) layer plays the role of minimizing the increase in the In composition fluctuation in the thickness direction, and will be referred to herein as a "fluctuation increase minimizing layer".

If the $In_tGa_{1-t}N$ (where 0≤t<s<1) fluctuation increase minimizing layer provided in the $In_sGa_{1-s}N$ (where 0<s<1) layer were too thick, then the former layer would function as a barrier layer. In that case, the $In_sGa_{1-s}N$ (where 0<s<1) layer would substantially have a thickness of only 4 nm or less, the emission wavelength would shorten, and high internal quantum efficiency would not be achieved. For that reason, it is recommended that the $In_tGa_{1-t}N$ (where 0≤t<s<1) fluctuation increase minimizing layer be deposited to such a thickness as to minimize the increase in the In composition fluctuation and yet not to interfere with the movement of carriers in the $In_sGa_{1-s}N$ (where 0<s<1) well layer.

The present inventors confirmed via experiments that even though the effect of minimizing the increase in fluctuation could be achieved when the fluctuation increase minimizing layer was at least as thick as one atomic layer, the emission wavelength started to shorten and the carrier confinement effect manifested itself when the layer was as thick as four or more atomic layers. For that reason, the $In_tGa_{1-t}N$ (where 0≤t<s<1) fluctuation increase minimizing layer is suitably at least as thick as one atomic layer and at most as thick as three atomic layers (i.e., in the range of 0.3 nm to 0.8 nm).

In the fluctuation increase minimizing layer, the In composition becomes a local minimum. The $In_tGa_{1-t}N$ (where $0 \le t < s < 1$) fluctuation increase minimizing layer does not function as a barrier layer against carriers, and therefore, does not affect significantly the distribution of carriers in the well layer. That is why the level in the well layer at which the probability of radiative recombination of carriers becomes the highest (i.e., the middle of the thickness of the well layer) does not change even if there is the fluctuation increase minimizing layer and is different from the level of the fluctuation increase minimizing layer. In other words, the level at which the In composition has a local minimum is different from the level in the well layer at which the probability of radiative recombination of carriers is the highest. It is at the middle of the thickness of the well layer that the probability of radiative recombination becomes the highest.

The present inventors concluded via experiments that the In composition (t) of the $In_tGa_{1-t}N$ (where $0 \le t < s < 1$) fluctuation increase minimizing layer should be decreased to less than 90% of the In composition (s) of the $In_sGa_{1-s}N$ (where $0 < s < 1$) well layer that forms its basis (i.e., $t < 0.9s$ needs to be satisfied). If the In composition (t) of the $In_tGa_{1-t}N$ (where $0 \le t < s < 1$) fluctuation increase minimizing layer were 90% or more of the In composition (s) of the $In_sGa_{1-s}N$ (where $0 < s < 1$) well layer (i.e., if $t \ge 0.9s$ were satisfied), it would be difficult to achieve the effect of minimizing the increase in the In composition fluctuation in the thickness direction. The fluctuation increase minimizing layer may also be a GaN layer including no In or an $Al_aIn_bGa_cN$ (where $0 < a \le 1, 0 \le b < 1, 0 < c \le 1$, and $b < 0.9s$) layer including Al.

If the $In_sGa_{1-s}N$ (where $0 < s < 1$) well layer, including the $In_tGa_{1-t}N$ (where $0 \le t < s < 1$) fluctuation increase minimizing layer, has a thickness of 6 nm to 20 nm, then the well layer can exhibit a high internal quantum efficiency. The well layer more suitably has a thickness of 9 nm to 17 nm, because even higher internal quantum efficiency will be achieved in that case. If the $In_sGa_{1-s}N$ (where $0 < s < 1$) well layer were deposited to a thickness of more than 20 nm, then lattice relaxation is highly likely to be caused due to accumulated strain. In a situation where the emission wavelength is longer than 450 nm, the lattice relaxation will be produced easily if the $In_sGa_{1-s}N$ (where $0 < s < 1$) well layer has a thickness of more than 17 nm and will be produced even more easily if the $In_sGa_{1-s}N$ (where $0 < s < 1$) well layer has a thickness of more than 20 nm. The lattice relaxation is a factor that will cause a decrease in luminous efficiency or reliability.

As the active layer of the light-emitting element, an $In_sGa_{1-s}N$ (where $0 < s < 1$) well layer which is separated by a barrier layer having a thickness of 7 nm to 40 nm to have a periodic structure in two cycles or more is preferred to an $In_sGa_{1-s}N$ (where $0 < s < 1$) well layer which is provided as a single layer by itself. The reason is that if there are multiple $In_sGa_{1-s}N$ (where $0 < s < 1$) well layers, it is possible to prevent the carried density in the well layers from becoming excessively high when the device is driven with a large current and the number of carriers overflowing out of the active layer can be reduced. In that case, the barrier layer that separates the $In_sGa_{1-s}N$ (where $0 < s < 1$) well layer may be any layer, as long as the layer has greater band gap energy than the $In_sGa_{1-s}N$ (where $0 < s < 1$) well layer and can play the role of confining carriers in the $In_sGa_{1-s}N$ (where $0 < s < 1$) well layer. If the thickness of the barrier layer were reduced to less than 7 nm, then the effect of confining carriers in the $In_sGa_{1-s}N$ (where $0 < s < 1$) well layer, of which the thickness is defined to be equal to or greater than 6 nm, would decrease significantly. On the other hand, if the thickness of the barrier layer were more than 40 nm, then it would be difficult to inject carriers evenly into multiple $In_sGa_{1-s}N$ (where $0 < s < 1$) well layers when the light-emitting element operates. Naturally, even if an n-type or p-type dopant such as Si or Mg is included in the barrier layer, the effect of this embodiment can also be achieved with no problem at all.

In one embodiment of the present disclosure, the In composition (t) of the $In_tGa_{1-t}N$ (where $0 \le t < s < 1$) fluctuation increase minimizing layer, which is provided in order to minimize the increase in the In composition fluctuation, and the In composition (s) of the $In_sGa_{1-s}N$ (where $0 < s < 1$) well layer that forms its basis satisfy the inequality $t < 0.9s$. That is to say, the In composition is suitably distributed in the $In_sGa_{1-s}N$ (where $0 < s < 1$) well layer so that a local maximum and a local minimum appear alternately in the thickness direction substantially in regular cycles, each of which is defined by a thickness of 4 nm or less, and that the local minimum of the In composition is less than 90% of the local maximum of the In composition, and that a portion with the local minimum In composition has a thickness of 0.3 nm to 0.8 nm. If such an In composition distribution is realized in the thickness direction, the effect of this embodiment can be achieved and any method may be used to make such an In composition distribution. To form the $In_tGa_{1-t}N$ (where $0 \le t < s < 1$) fluctuation increase minimizing layer is one of effective means for achieving the effect of this embodiment.

As for the periodicity of the In composition distribution, no strict periodicity is required to achieve the effect of this embodiment. As long as the distribution can turn out, as a result of some method of analysis, to be what a skilled person would call a periodic one, the effect of this embodiment can be achieved sufficiently.

FIG. 6 is a graph showing the In composition on a cross section of an InGaN well layer which was deposited with its target thickness set to be 9 nm. Specifically, in this graph, image contrasts obtained by carrying out a high resolution TEM analysis are expressed in numerical values and represented as a histogram corresponding to the thickness direction. In this graph, the larger the numerical value, the higher the In composition.

FIG. 6(a) is a graph showing the results obtained for a sample (representing a comparative example) in which no countermeasure was taken against the In composition fluctuation in the thickness direction. On the left-hand side of this graph, shown is a high resolution TEM image of this comparative example. The lightness of this high resolution TEM image corresponds to the In composition. And the numerical value representation of the image contrast of this high resolution TEM image as indicated by the arrow on the image is the graph shown in FIG. 6(a).

On the other hand, FIG. 6(b) is a graph showing the results obtained for a specific example of the present disclosure. On the left-hand side of this graph, also shown is a high resolution TEM image. And the numerical value representation of the image contrast of this high resolution TEM image as indicated by the arrow on the image is the graph shown in FIG. 6(b). This specific example is a sample in which a "fluctuation increase minimizing layer" having a thickness of 0.8 nm was provided to split the InGaN well layer into two, each having a thickness of approximately 3 nm, in the thickness direction and to intentionally reduce the rate of the In source material supplied. More specifically, this single well layer consists of two fluctuation increase minimizing layers and three partial layers divided by the two fluctuation increase minimizing layers. In this case, each of the "fluctuation increase minimizing layers" functions as a dividing layer. In the sample shown in FIG. 6(b), the well layer has an overall thickness of approximately 10.6 nm (=3 nm×3 layers+0.8 nm×2 layers).

The In composition of the fluctuation increase minimizing layer is lower than that of the divided partial layers (and is typically less than 90%). However, each fluctuation increase minimizing layer does form part of the single well layer and does function as a portion of that well layer. That is to say, the fluctuation increase minimizing layer is not a "barrier layer".

In the sample shown in FIG. 6(a) in which no countermeasure was taken at all, the contrast representing the In composition in the thickness direction increases and decreases repeatedly and alternately, and therefore, there are multiple levels with local maximums and local minimums inside the InGaN well layer, which agrees with the results shown in FIGS. 5(a) and 5(b). In this description, the local maximum and local minimum of the In composition mean local maximum and local minimum on envelopes with flattened RF noise on the graph representing the In composition.

As can be seen from its high resolution TEM image, the In composition of the sample shown in FIG. 6(a) fluctuates in the in-plane direction, too. In the sample of this comparative example, the In composition also fluctuates in the in-plane direction, and therefore, if a high resolution TEM analysis is carried out on a different cross section, a different histogram from that of the graph shown in FIG. 6(a) will be obtained.

In this manner, local minimums and local maximums also appear in the In composition distribution represented by the graph shown in FIG. 6(a). In this case, however, a level (as measured from the lower surface of the InGaN well layer) representing a local minimum on one cross section does not always agree with a level (as measured from the lower surface of the InGaN well layer) representing a local minimum of the In composition distribution on another cross section.

On the other hand, in the specific example of the present disclosure, the contrast fluctuates substantially periodically, and local minimums and local maximums appear alternately in the In composition distribution in the thickness direction as can be seen from the graph shown in FIG. 6(b). Also, look at the high resolution TEM image of this specific example, and it can be seen that a portion with high lightness is divided by a portion with low lightness (i.e., portion with a relatively low In composition). In other words, the levels in the thickness direction at which the In composition distribution has a local minimum (i.e., the distances as measured from the lower surface of the InGaN well layer) are constant in the in-plane direction, and portions with relatively low In compositions form a layer that runs parallel to the lower surface of the InGaN well layer.

If an InGaN well layer having a thickness of approximately 9 nm is divided into three elements, each having a thickness of 3 nm, and if the average In composition of each of those elements is calculated, then the variation between those elements will be less in the sample shown in FIG. 6(b) than in the sample shown in FIG. 6(a). That is to say, it can be said that the InGaN well layer with the "fluctuation increase minimizing layer" has a more uniform In composition over the entire well layer. In FIG. 6(b), a portion representing a local minimum contrast corresponds to the fluctuation increase minimizing layer, for which the supply of the In source material is reduced, and the magnitude of the contrast (corresponding to the In composition) of a portion representing a local minimum is less than 90% of that of the contrast (corresponding to the In composition) of a portion representing a local maximum.

PCT International Application Publication No. 2007/026767 discloses a structure in which in an active layer where crystals grow from a c plane that is a polar plane, the InGaN well layer is separated by a barrier layer (delta layer) with a thickness of less than 1 nm. According to PCT International Application Publication No. 2007/026767, however, that barrier layer is provided for the purpose of flattening the unevenness of the carrier distribution resulting from the occurrence of internal electric polarization, which is unavoidable when a c-plane growing process is adopted, and the delta layer clearly functions as a barrier layer. And unless the InGaN well layer is provided so as to sandwich that delta layer, their effect cannot be achieved and the InGaN well layer never contributes to emitting light. On the other hand, since the target of this embodiment is a non-polar m-plane-growing InGaN well layer, no internal electric polarization will be produced in the first place and no bias should be produced in the carrier distribution, either. The $Al_a In_b Ga_c N$ (where $0<a\leq1$, $0\leq b<1$, $0<c\leq1$, and $b<0.9s$) layer is inserted just for the purpose of minimizing the increase in fluctuation in the In composition in the thickness direction. The $Al_a In_b Ga_c N$ (where $0<a\leq1$, $0\leq b<1$, $0<c\leq1$, and $b<0.9s$) layer in the well layer has too small a thickness of 0.3 nm to 0.8 nm to function as a barrier layer.

Optionally, multiple InGaN well layers, each having a "fluctuation increase minimizing layer", may be separated from each other by a barrier layer having a thickness of 7 nm to 40 nm. Even so, since each InGaN well layer is also a non-polar m-plane growing layer and since the fluctuation in In composition is minimized, the carrier distribution should also be uniform in each InGaN well layer, and each InGaN well layer should be able to contribute to emitting light with expected good efficiency. To provide multiple InGaN well layers is an effective measure to take, because the light-emitting element can maintain high efficiency even when driven with a large current. And this is a feature of this embodiment that is clearly different from PCT International Application Publication No. 2007/026767 and indicates that this embodiment has a totally different spirit of disclosure from PCT International Application Publication No. 2007/026767.

In the specific example shown in FIG. 6(b), each single InGaN well layer includes two "fluctuation increase minimizing layers". However, the well layer of this embodiment does not have to have such a structure. Alternatively, according to this embodiment, each single well layer may have only one "fluctuation increase minimizing layer". In that case, the In composition of the well layer will have a single local minimum at a level that is defined by a certain distance from the lower surface. In the In composition distribution in such a situation, there are not always two local maximums on both sides of the level with the local minimum.

(Embodiment 1)

Figure 7:
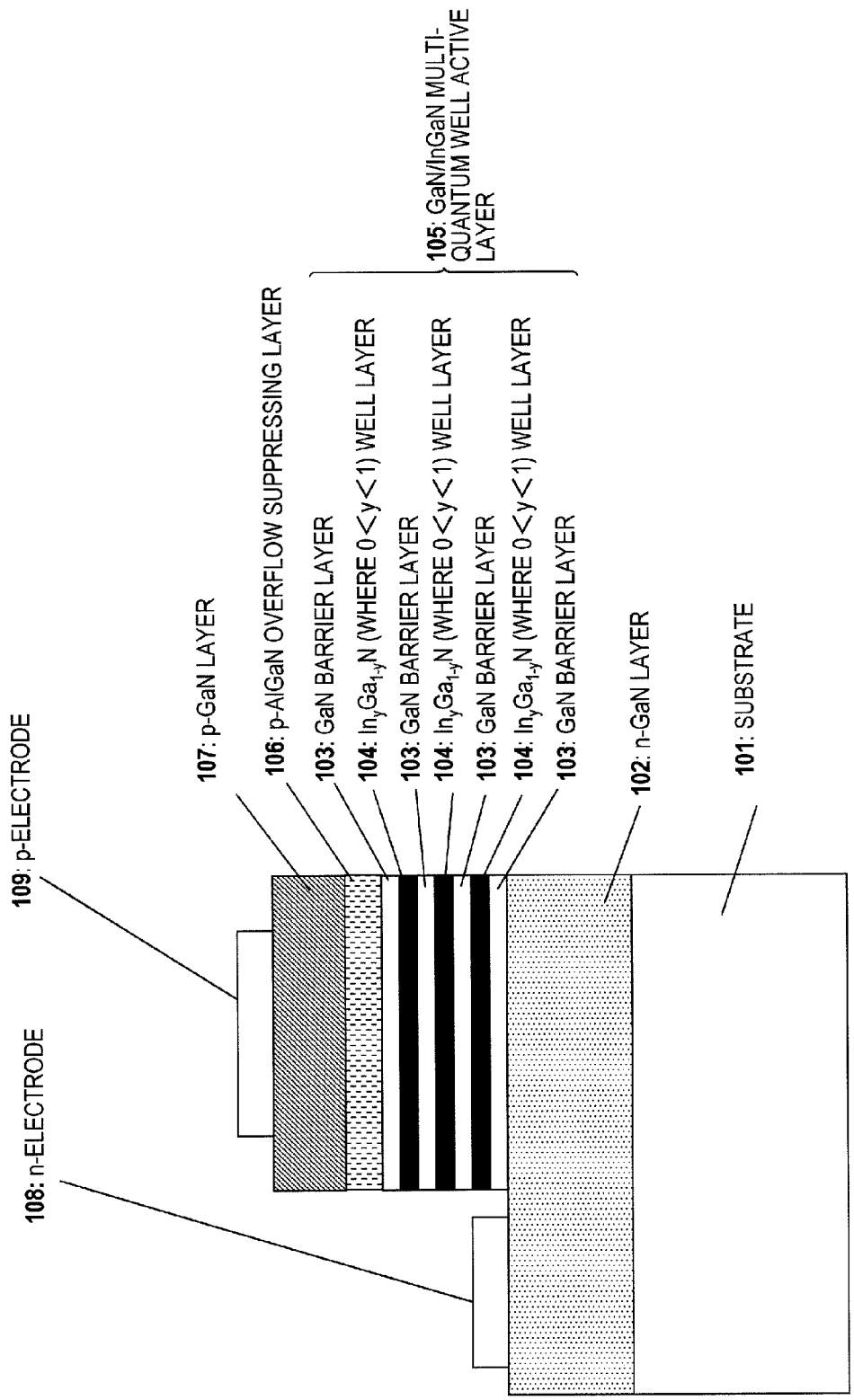
FIG. 7 is a vertical cross-sectional view schematically illustrating the structure of a nitride gallium nitride based compound semiconductor light-emitting element as an embodiment of the present disclosure.

Hereinafter, a gallium nitride based compound semiconductor light-emitting element will be described as an embodiment of the present disclosure with reference to FIG. 7.

A crystal growing substrate 101 for use in this embodiment may be an m-plane GaN substrate, or an m-plane SiC substrate, of which the surface is covered with an m-plane GaN layer, or an r-plane or m-plane sapphire substrate, of which the surface is covered with an m-plane GaN layer. The point is that the active layer should be an m-plane nitride based semiconductor layer.

According to the present disclosure, the "m plane" may be a plane that tilts in a predetermined direction and defines a tilt angle of ±5 degrees or less with respect to an m plane that is not tilted. The growing plane of an actual m-plane semiconductor layer does not always have to be perfectly parallel to an m plane but may define a predetermined tilt angle with respect to the m plane. The tilt angle is defined by the angle that is formed between a normal to the principal surface of the active layer and a normal to the m plane. The absolute value of the tilt angle θ may be 5 degrees or less, and is suitably 1 degree or less, in the c-axis direction, and may be 5 degrees or less, and is suitably 1 degree or less, in the a-axis direction, too. Although the "m plane" is tilted overall with respect to the ideal m plane, the former plane actually consists of a number of steps, each of which is as thick as one to several atomic layers, and includes a huge number of m-plane regions, speaking microscopically. That is why planes that are tilted at an angle of 5 degrees or less (which is the absolute value) with respect to an m plane would have similar properties to those of the m plane. However, if the absolute value of the tilt angle θ is more than 5 degrees, the internal quantum efficiency could decrease due to a piezoelectric field. Nevertheless, even if the tilt angle θ is set to be 5 degrees, for example, the actual tilt angle θ could be different from 5 degrees by approximately ±1 degree due to some variation involved with the manufacturing process. It is difficult to totally eliminate such a manufacturing process induced variation and such a small angular difference as this would not diminish the effect of the present disclosure.

The gallium nitride-based compound semiconductor to form the GaN/InGaN multi-quantum well active layer 105 and other layers is deposited by MOCVD (metalorganic chemical vapor deposition) method. First of all, the substrate 101 is washed with a buffered hydrofluoric acid (BHF) solution, rinsed with water, and then dried sufficiently. The substrate 101 that has been washed in this manner is transported to the reaction chamber of an MOCVD system with its exposure to the air avoided as successfully as possible. Thereafter, with only ammonia ($NH_3$) gas supplied as a nitrogen source gas, the substrate is heated to 850 degrees Celcius to clean the surface of the substrate.

Next, with a trimethylgallium (TMG) gas or a triethylgallium (TEG) gas and a silane ($SiH_4$) gas supplied, the substrate is heated to about 1100 degrees Celsius to deposit an n-GaN layer 102. The silane gas is the source gas of Si as an n-type dopant.

Next, the supply of the $SiH_4$ gas is stopped and the temperature of the substrate is lowered to less than 800 degrees Celcius, thereby forming a GaN barrier layer 103. In addition, a trimethylindium (TMI) gas also starts to be supplied, thereby depositing an $In_yGa_{1-y}N$ (where 0<y<1) well layer 104. In this embodiment, by alternately forming the GaN barrier layers 103 and $In_yGa_{1-y}N$ (where 0<y<1) well layers 104 in two or more cycles, a GaN/InGaN multi-quantum well active layer 105 that will emit light is formed. In this case, these layers are formed in two or more cycles, because the larger the number of the $In_yGa_{1-y}N$ (where 0<y<1) well layers 104, the more perfectly an excessive increase in the carrier density in the well layer can be avoided when the device is driven with a large current, the more significantly the number of carriers overflowing out of the active layer can be reduced, and eventually the better the performance of the element can be. Nevertheless, a single active layer may have a single $In_yGa_{1-y}N$ (where 0<y<1) well layer 104 which is interposed between two barrier layers 104.

The $In_yGa_{1-y}N$ (where 0<y<1) well layer 104 is suitably deposited by adjusting the growing time so that the layer will have a thickness of 6 nm to 20 nm. On the other hand, the GaN barrier layer 103 to separate the $In_yGa_{1-y}N$ (where 0<y<1) well layer 104 is suitably deposited by adjusting the growing time so that the layer will have a thickness of 7 nm to 40 nm.

According to this embodiment, when the $In_yGa_{1-y}N$ (where 0<y<1) well layer 104 is formed, a fluctuation increase minimizing layer 110 is formed in the well layer 104 by the method to be described in detail later.

Figure 8:
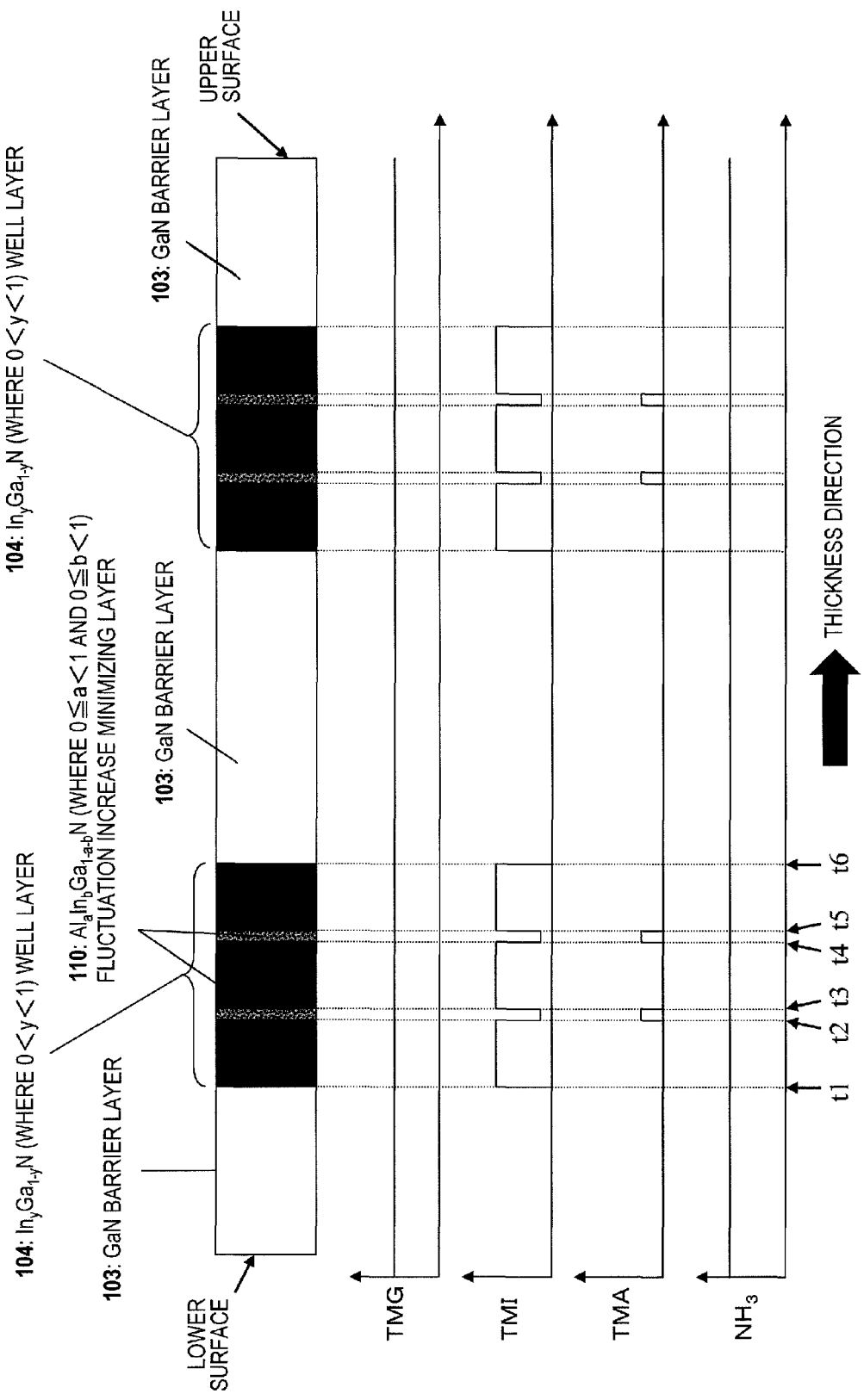
FIG. 8 is a schematic representation showing an exemplary growing sequence to form the active layer of a nitride gallium nitride based compound semiconductor light-emitting element as an embodiment of the present disclosure.

Hereinafter, an exemplary process for forming the GaN/InGaN multiple quantum well active layer 105 will be described with reference to FIG. 8, which shows a cross-sectional structure of the GaN/InGaN multiple quantum well active layer 105 to be formed in this embodiment and an example of a source gas supply sequence while the active layer is being formed. In the example illustrated in FIG. 8, three GaN barrier layers 103 and two $In_yGa_{1-y}N$ (where 0<y<1) well layers 104 are stacked alternately. These GaN barrier layers 103 and $In_yGa_{1-y}N$ (where 0<y<1) well layers 104 grow from the left to the right on the paper on which FIG. 8 is drawn and the bold arrow shown in FIG. 8 indicates the "thickness direction".

In this embodiment, in depositing an $In_yGa_{1-y}N$ (where 0<y<1) well layer 104, TMI starts to be supplied at a time t1 and then has its supply either reduced or stopped at a time t2 before the thickness of the $In_yGa_{1-y}N$ (where 0<y<1) well layer 104 reaches 4 nm. At this point in time, as the case may be, trimethylaluminum (TMA) may also be supplied at an appropriate flow rate. In the example illustrated in FIG. 8, while the supply of TMI is being reduced, TMA is supplied. In this manner, according to this embodiment, an $Al_aIn_bGa_cN$ (where 0≤a≤1, 0≤b<1 and 0<c≤1) fluctuation increase minimizing layer 110, of which the In composition is intentionally set to be lower than the rest of the $In_yGa_{1-y}N$ (where 0<y<1) well layer 104, is formed.

The period of time for which supply of TMI is either reduced or stopped in order to form the fluctuation increase minimizing layer 110 is from the time t2 through a time t3. The interval (t3-t2) in which the supply rate of In is reduced while the $In_yGa_{1-y}N$ (where 0<y<1) well layer 104 is growing may be 2 to 8 seconds, for example, which accounts for 30% or less of the time it takes to grow a single $In_yGa_{1-y}N$ (where 0<y<1) well layer 104. In this manner, the left one of the two fluctuation minimizing layers 110 in the $In_yGa_{1-y}N$ (where 0<y<1) well layer 104 shown in FIG. 8 is formed. Although the fluctuation minimizing layer 110 is illustrated as a definite "layer" in FIG. 8, the In composition does not have to change stepwise at the interface of the fluctuation minimizing layer 110. As long as there is a portion with a locally decreased In composition at a level that is defined by a certain distance from the lower surface of the $In_yGa_{1-y}N$ (where 0<y<1) well layer 104 and if that portion runs parallel in the in-plane direction, then that portion is the "fluctuation minimizing layer 110".

After the $Al_aIn_bGa_cN$ (where 0≤a≤1, 0≤b<1 and 0<c≤1) fluctuation increase minimizing layer 110 has been deposited to a thickness corresponding to one to three atomic layers (i.e., 0.3 to 0.8 nm), the supply of TMA is stopped at the time t3, and the flow rate of TMI is increased to the original one again to continue to deposit the $In_yGa_{1-y}N$ (where 0<y<1) well layer 104. And before the thickness of the $In_yGa_{1-y}N$ (where 0<y<1) well layer 104 on the fluctuation increase minimizing layer 110 reaches 4 nm again (at a time t4), the supply of TMI is either reduced or stopped again. At this point in time, as the case may be, TMA may also be supplied at an appropriate flow rate. In this manner, a second $Al_aIn_bGa_cN$ (where 0≤a≤1, 0≤b<1 and 0<c≤1) fluctuation increase minimizing layer 110 is formed. The period of time for which supply of TMI is either reduced or stopped is from the time t4 through a time t5.

After that, TMI is supplied from the time t5 through a time t6 until just before the thickness of the $In_yGa_{1-y}N$ (where 0<y<1) well layer 104 on the second fluctuation increase minimizing layer 110 reaches 4 nm again, thereby forming the rest of the $In_yGa_{1-y}N$ (where 0<y<1) well layer 104.

By repeatedly performing this series of process steps a number of times, the $In_yGa_{1-y}N$ (where $0<y<1$) well layer 104, including the $Al_aIn_bGa_cN$ (where $0\le a\le 1$, $0\le b<1$ and $0<c\le 1$) fluctuation increase minimizing layer 110, is deposited to an intended thickness. It should be noted that the $Al_aIn_bGa_cN$ (where $0\le a\le 1$, $0\le b<1$ and $0<c\le 1$) fluctuation increase minimizing layer 110 is inserted into each of the $In_yGa_{1-y}N$ (where $0<y<1$) well layers 104 which are separated from each other by the GaN barrier layer 103.

In the example illustrated in FIG. 8, a second $In_yGa_{1-y}N$ (where $0<y<1$) well layer 104 which is sandwiched between two GaN barrier layers is formed by performing a similar series of process steps. However, the layer does not always have to be formed in that way according to this embodiment. Optionally, a single active layer may include three or more $In_yGa_{1-y}N$ (where $0<y<1$) well layers 104. If two or more $In_yGa_{1-y}N$ (where $0<y<1$) well layers 104 are formed, the respective well layers 104 may have mutually different structures and thicknesses.

In this embodiment, the growing process condition was adjusted by the method described above so that the emission wavelength became around 450 nm, thereby forming a GaN/InGaN multiple quantum well active layer A (representing a comparative example) in which InGaN well layers each having a thickness of 9 nm and GaN barrier layers each having a thickness of 15 nm were alternately stacked in three cycles. In addition, another GaN/InGaN multiple quantum well active layer B was separately formed as a specific example of the present disclosure. In the multiple quantum well active layer B, InGaN well layers, each having a thickness of 9 nm, too, but having had two GaN layers having a thickness of 0.8 nm inserted into the two levels at which the InGaN well layer was divided into three pieces each having a thickness of 3 nm (i.e., when the InGaN layer was deposited to a thickness of 3 nm and a thickness of 6 nm), and GaN barrier layers each having a thickness of 15 nm were alternately stacked in three cycles. In this case, the single well layer came to have a thickness of 10.6 nm in total. Specifically, the growing process condition included a growing temperature of 750 degrees Celcius, a growing pressure of 300 Torr, a TMG supply flow rate of 33 µmol/min and an $NH_3$ supply flow rate of 0.8 mol/min in both cases. These flow rates were kept constant but TMI was supplied at a flow rate of 170 µmol/min only while the InGaN well layer was deposited.

Figure 9:
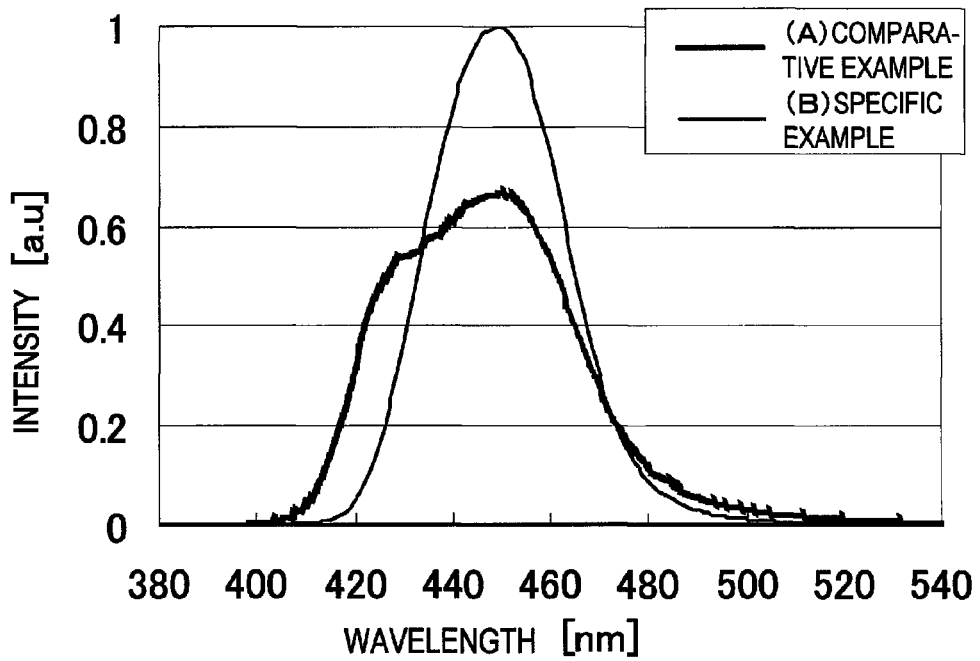
FIG. 9 is a graph showing the results of a photoluminescence measurement which was carried out on a sample that had been made as an embodiment of the present disclosure.

These comparative and specific examples had their PL measured. The results of the PL measured are shown in FIG. 9.

The comparative example (A) which was made by the standard method came to have a PL spectrum having a very large half width, of which the intensity reached a peak at a particular wavelength and reached another peak at a shorter wavelength than the particular one. This result suggests that it would be difficult to control the emission wavelength of the InGaN well layer having a thickness of 9 nm.

On the other hand, in the specific example (B) into which the $Al_aIn_bGa_cN$ (where $a=0$, $b=0$, $b=0$ and $c=1$) fluctuation increase minimizing layer had been inserted, the double peaks disappeared, a single-peak spectrum was obtained, and the half width also decreased by approximately 10 nm. This is a result indicating that the fluctuation in the In composition in the thickness direction, which had been caused in the thick $In_yGa_{1-y}N$ (where $0<y<1$) well layer 104, decreased. According to one embodiment of the present disclosure, it is possible to prevent the emission spectrum from becoming too broad and to increase the yield of the emission wavelength.

The present inventors discovered via experiments that in a situation where an InGaN well layer was deposited to a thickness of 9 nm with the growing condition adjusted so that the emission wavelength would be 450 nm, if the In supply rate was kept constant, then an In composition fluctuation having a width of ±30% at maximum would be produced with respect to the average In composition as shown in FIG. 5(b). According to an embodiment of the present disclosure, however, each of the partial layers which has been divided by the fluctuation increase minimizing layer comes to have an In composition fluctuation of within ±10%. That is to say, the average In composition at any plane of each partial layer which is parallel to either the thickness direction or the growing direction is within ±10% of the average In composition of that partial layer as a whole. Thus, according to this embodiment, by intentionally stopping or reducing the supply of In during the growth of the well layer, the In composition fluctuation can be reduced overall.

To cope with such a fluctuation in the In composition in the thickness direction of the $In_yGa_{1-y}N$ (where $0<y<1$) well layer 104, the method of this embodiment could be replaced by changing the growing condition semi-continuously. For example, if the In composition tends to increase in the thickness direction, the supply of TMI may be decreased gradually or the growing temperature may be raised progressively within appropriate ranges as the $In_yGa_{1-y}N$ (where $0<y<1$) well layer 104 is deposited. Then, In atoms would be introduced into crystals at a decreased rate and the In composition in the thickness direction could be constant eventually. On the other hand, if the In composition tends to decrease in the thickness direction, the supply of TMI may be increased gradually or the growing temperature may be lowered progressively within appropriate ranges as the $In_yGa_{1-y}N$ (where $0<y<1$) well layer 104 is deposited.

To do this, however, the tendency of the In composition fluctuation in the thickness direction should naturally be understood and the growing condition should be controlled so as to cancel that fluctuation. The present inventors discovered via experiments that the In composition fluctuation in the thickness direction is an irregular one and has a certain width. That is to say, the In composition fluctuation may sometimes increase in the thickness direction, sometimes decrease in the thickness direction, or may not change so dramatically. It is also impossible to change the growing condition semi-continuously so as to compensate for such instability of each growing process. And even if that has been done by any chance, it should be difficult to repeat it once again. Since the In composition fluctuation also involves instability in the in-plane direction as described above, it is difficult to overcome this problem just by changing the growing condition continuously.

In this respect, according to this embodiment, the In composition can be adjusted uniformly within the same plane and the In composition fluctuation in the thickness direction can be reduced effectively. On top of that, compared to changing the growing condition semi-continuously, it is much easier to get the same control done over and over again.

Besides, the growing method of this embodiment is much less troublesome than the method of Japanese Laid-Open Patent Publication No. 2009-267124. The $Al_aIn_bGa_cN$ (where $0\le a\le 1$, $0\le b<1$ and $0<c\le 1$) fluctuation increase minimizing layer 110 can be deposited just by changing the supply rate of TMI (and TMA as the case may be) while the $In_yGa_{1-y}N$ (where $0<y<1$) well layer 104 is growing. That layer can be deposited with the growing temperature, growing pressure and other growing conditions unchanged. That is why it can be said that this is a very simple and highly productive method.

As can be seen, the $Al_aIn_bGa_cN$ (where $0 \le a \le 1$, $0 \le b < 1$ and $0 < c \le 1$) fluctuation increase minimizing layer 110 to be inserted into the middle of the $In_yGa_{1-y}N$ (where $0 < y < 1$) well layer 104 in an embodiment of the present disclosure is as thin a layer as just one to three atomic layers, but does contribute very effectively to reducing the In composition fluctuation in the thickness direction of the $In_yGa_{1-y}N$ (where $0 < y < 1$) well layer 104.

Now take a look at FIG. 7 again.

After the GaN/InGaN multi-quantum well active layer 105 has been deposited, the supply of the TMI gas is stopped and the hydrogen gas starts to be supplied again as a carrier gas, in addition to the nitrogen gas. Furthermore, the growing temperature is raised to the range of 850 degrees Celsius to 1000 degrees Celsius, and trimethylaluminum (TMA) and bis(cyclo-pentadienyl)magnesium ($Cp_2Mg$), which is a source gas of Mg as a p-type dopant, are supplied to form a p-AlGaN overflow suppressing layer 106. Next, the supply of the TMA gas is stopped to deposit a p-GaN layer 107.

Thereafter, the substrate is unloaded from the reaction chamber and only predetermined portions of the p-GaN layer 106 and GaN/InGaN multi-quantum well active layer 105 are removed by performing photolithography and etching processes, for example, thereby exposing a portion of the n-GaN layer 102. On the exposed region of the n-GaN layer 102, an n-side electrode 108 consisting of Ti/Al layers is formed. On the other hand, a p-side electrode 109 may consist of Pd/Pt layers, for example.

By performing these process steps, n-type carriers and p-type carriers can be injected, and a light-emitting element, of which the GaN/InGaN multiple quantum well active layer 105 fabricated by the method of this embodiment can emit light at an intended wavelength, can be obtained.

(Embodiment 2)

The light-emitting element of the embodiment described above may be used as a light source as it is. However, when combined with a resin including a phosphor to change the wavelength, for example, the light-emitting element of this embodiment can be used effectively as a light source having a broadened wavelength range (e.g., as a white light source).

Figure 10:
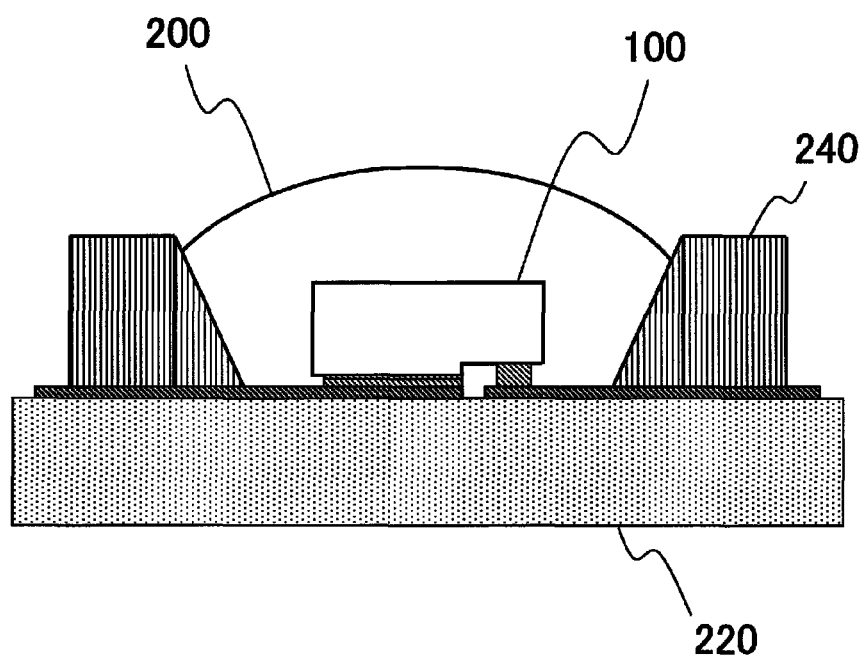
FIG. 10 is a cross-sectional view illustrating an embodiment as a white light source.

FIG. 10 is a schematic representation illustrating an example of such a white light source. The light source shown in FIG. 10 includes the light-emitting element 100 having the configuration shown in FIG. 7 and a resin layer 200 in which a phosphor (such as YAG (yttrium aluminum garnet)) to change the wavelength of the light emitted from the light-emitting element 100 into a longer wavelength is dispersed. The light-emitting element 100 is mounted on a supporting member 220 on which an interconnect pattern has been formed. And on the supporting member 220, a reflective member 240 is arranged so as to surround the light-emitting element 100. The resin layer 200 is arranged to cover the light-emitting element 100.

This embodiment provides a light-emitting element which comprises, as its active layer, a well layer which grows from a gallium nitride based compound semiconductor's m plane that is free from the quantum confinement Stark effect and of which the In composition hardly fluctuates in the thickness direction. Thus, by applying this embodiment, a well layer which achieves high internal quantum efficiency can be made with the yield of the emission wavelength increased sufficiently.

The present disclosure can be used in light-emitting diodes (LEDs) and semiconductor laser diodes, for example.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A gallium nitride based compound semiconductor light-emitting element comprising an active layer,
   the active layer including a well layer and a barrier layer, each of the well layer and the barrier layer being a semiconductor layer which has an m plane as its growing plane, and
   the well layer having a lower surface and an upper surface and having an In composition distribution in which the composition of In changes according to a distance from the lower surface in a thickness direction of the well layer, and
   wherein the In composition of the well layer has a local minimum at a level that is defined by a certain distance from the lower surface and a portion of the well layer where the In composition has the local minimum runs parallel to the lower surface, and
   the In composition of the well layer has a local minimum at multiple levels that are defined by multiple different distance from the lower surface and has a local maximum between those levels.

2. The gallium nitride based compound semiconductor light-emitting element of claim 1, wherein the local minimum of the In composition is less than 90% of the local maximum of the In composition.

3. The gallium nitride based compound semiconductor light-emitting element of claim 1, wherein the local maximum and the local minimum alternate with each other in a cycle that is defined by a thickness of 4 nm or less.

4. A gallium nitride based compound semiconductor light-emitting element comprising an active layer,
   the active layer including a well layer and a barrier layer, each of the well layer and the barrier layer being a semiconductor layer which has an m plane as its growing plane, and
   the well layer including at least one dividing layer which divides the well layer into multiple partial layers, and
   wherein the In composition of the dividing layer is less than 90% of the In composition of the partial layers.

5. The gallium nitride based compound semiconductor light-emitting element of claim 4, wherein the dividing layer divides the well layer so that the partial layers each have a thickness of 3 nm or less.

6. The gallium nitride based compound semiconductor light-emitting element of claim 4, wherein the dividing layer is made of $Al_aIn_bGa_cN$ (where $0 \le a \le 1$, $0 \le b < 1$ and $0 < c \le 1$).

7. The gallium nitride based compound semiconductor light-emitting element of claim 4, wherein the dividing layer has a thickness of 0.3 nm to 0.8 nm.

8. The gallium nitride based compound semiconductor light-emitting element of claim 4, wherein in the dividing layer, the average of the In composition at any of planes that are parallel to each other in the thickness direction is within ±10% of the average In composition of the entire dividing layer.

9. The gallium nitride based compound semiconductor light-emitting element of claim 1, wherein the well layer is made of $Al_xIn_yGa_zN$ (where $0 \le x < 1$, $0 < y < 1$ and $0 < z < 1$).

10. The gallium nitride based compound semiconductor light-emitting element of claim 1, wherein the well layer has a thickness of 6 nm to 20 nm.

11. The gallium nitride based compound semiconductor light-emitting element of claim 1, wherein the barrier layer has a thickness of 7 nm to 40 nm.

12. The gallium nitride based compound semiconductor light-emitting element of claim 1, wherein the active layer has a multiple quantum well structure.

13. The gallium nitride based compound semiconductor light-emitting element of claim 1, wherein the active layer includes the well layers and the barrier layers arranged between the well layers.

14. The gallium nitride based compound semiconductor light-emitting element of claim 1, wherein the local minimum level is different from a level in the well layer at which the probability of radiative recombination of carriers is the highest.

15. A light source comprising:
the gallium nitride based compound semiconductor light-emitting element of claim 1; and
a wavelength changing section which includes a phosphor that changes the wavelength of light emitted from the gallium nitride based compound semiconductor light-emitting element.

16. The gallium nitride based compound semiconductor light-emitting element of claim 4, wherein the dividing layer is different from a level in the well layer at which the probability of radiative recombination of carriers is the highest.

* * * * *